United States Patent [19]

Kabadi

[11] Patent Number: 4,917,613
[45] Date of Patent: Apr. 17, 1990

[54] HIGH DENSITY CONNECTION SYSTEM

[75] Inventor: Ashok N. Kabadi, Beaverton, Oreg.

[73] Assignee: Intel Corporation, Santa Clara, Calif.

[21] Appl. No.: 267,028

[22] Filed: Nov. 4, 1988

[51] Int. Cl.[4] ............................................. H01R 9/09
[52] U.S. Cl. .................................... 439/67; 439/457; 439/493
[58] Field of Search ....................... 439/67, 68, 69, 70, 439/71, 74, 456, 457, 458, 449, 473, 493, 495, 499, 496, 494; 361/398; 174/72 A

[56] References Cited

U.S. PATENT DOCUMENTS

| | | | |
|---|---|---|---|
| 2,406,144 | 8/1946 | Herman | 439/458 |
| 2,854,502 | 9/1958 | Richter | 439/493 X |
| 3,079,579 | 2/1963 | Crimmins et al. | 439/457 X |
| 3,419,670 | 12/1968 | Schneider | 439/458 X |
| 3,432,794 | 3/1969 | Churla | 439/494 X |
| 3,462,542 | 8/1969 | Richter | 439/495 X |
| 4,257,028 | 3/1981 | Narozny et al. | 439/494 X |
| 4,475,785 | 10/1984 | Müller et al. | 439/456 X |
| 4,716,500 | 12/1987 | Payne | 439/67 X |
| 4,808,112 | 2/1989 | Wood | 439/67 X |

FOREIGN PATENT DOCUMENTS

| | | | |
|---|---|---|---|
| 984927 | 3/1976 | Canada | 439/495 |
| 438614 | 12/1926 | Fed. Rep. of Germany | 439/456 |
| 2348992 | 4/1974 | Fed. Rep. of Germany | 439/495 |
| 1092517 | 11/1967 | United Kingdom | 439/456 |

Primary Examiner—William Briggs
Attorney, Agent, or Firm—Blakely, Sokoloff, Taylor & Zafman

[57] ABSTRACT

A connector system for coupling electrical cables with electrical apparatus such as integrated circuits and printed circuit boards. The present invention discloses a connector system for coupling electrical cables, preferably high density flexible circuits, with electrical apparatus. The connection system discloses a stiffener plate having a slot therein cut at a 45 degree angle from one corner of the stiffener plate to a second distal point of the stiffener plate. A pair of flexible circuits may be disposed in the stiffener plate and bent at 90 degree angles to the plate for coupling to a surface of the stiffener plate. The flexible circuits are of a design allowing for placement of electrical conductive pads along four edges of the stiffener plate, thus maximizing the density of electrical connections in the connection system.

11 Claims, 5 Drawing Sheets

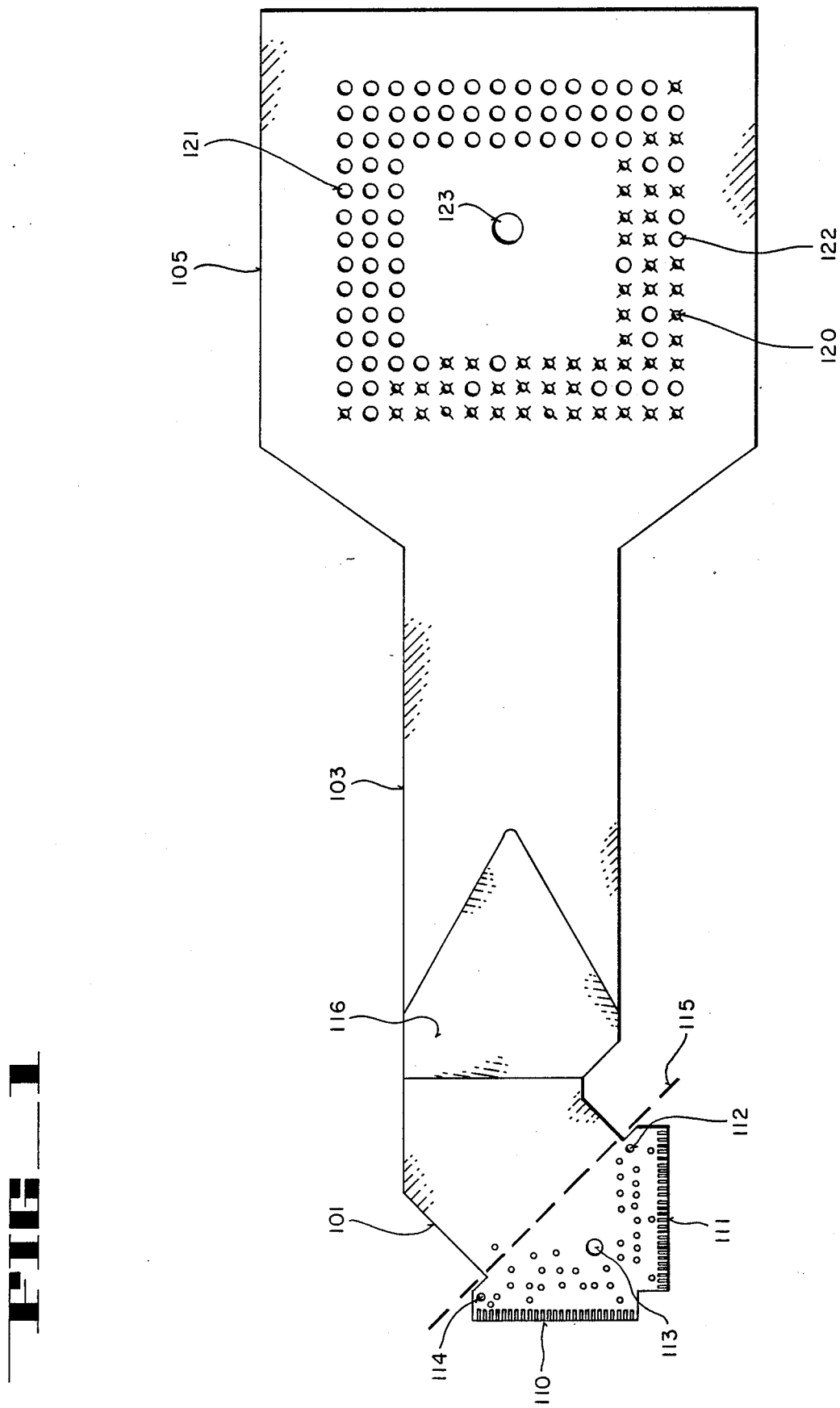

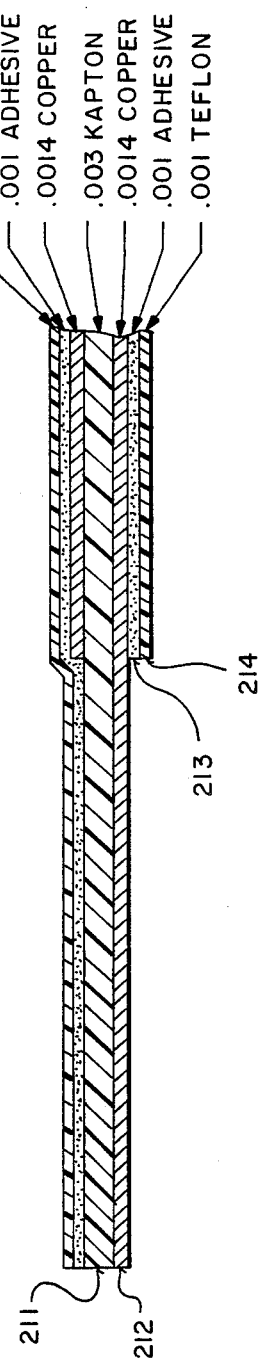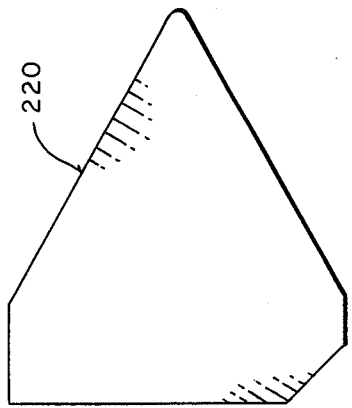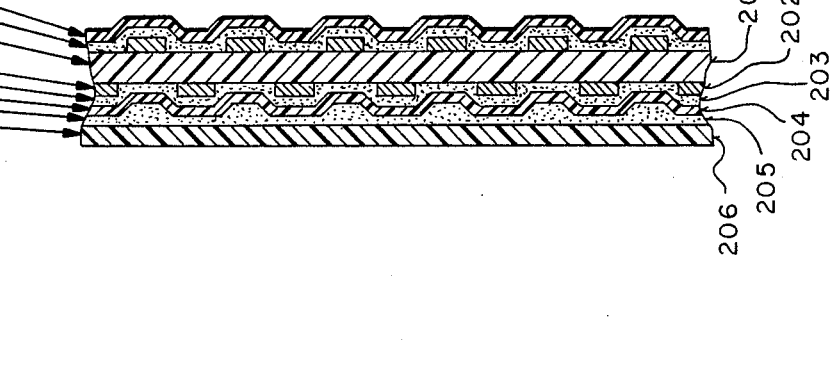

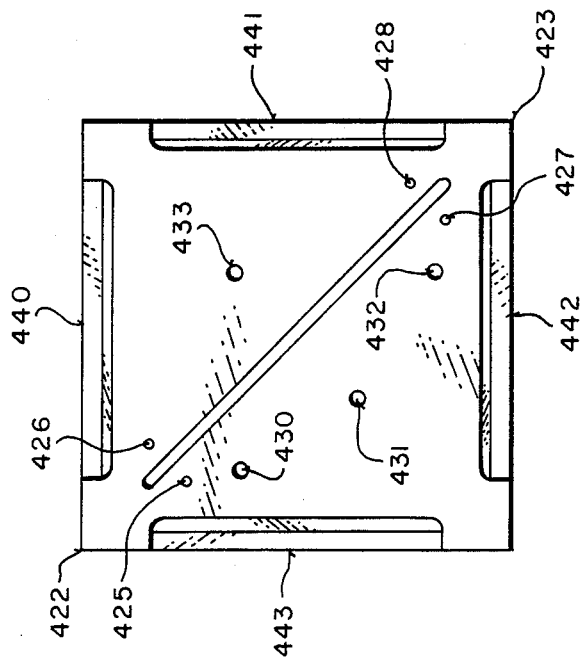
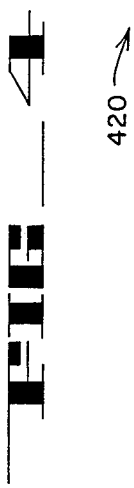
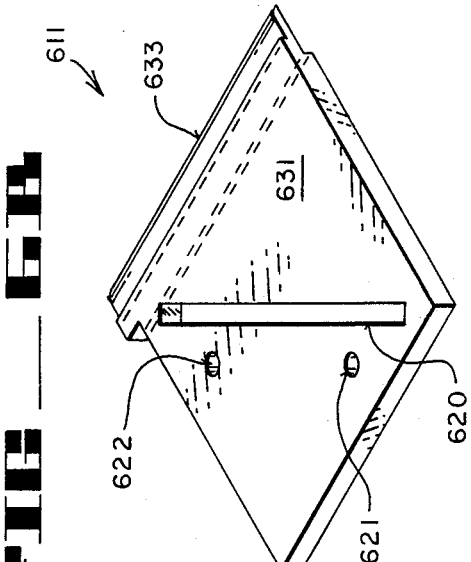
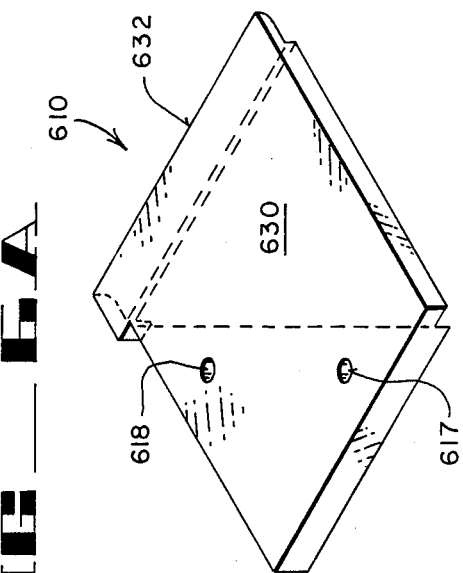

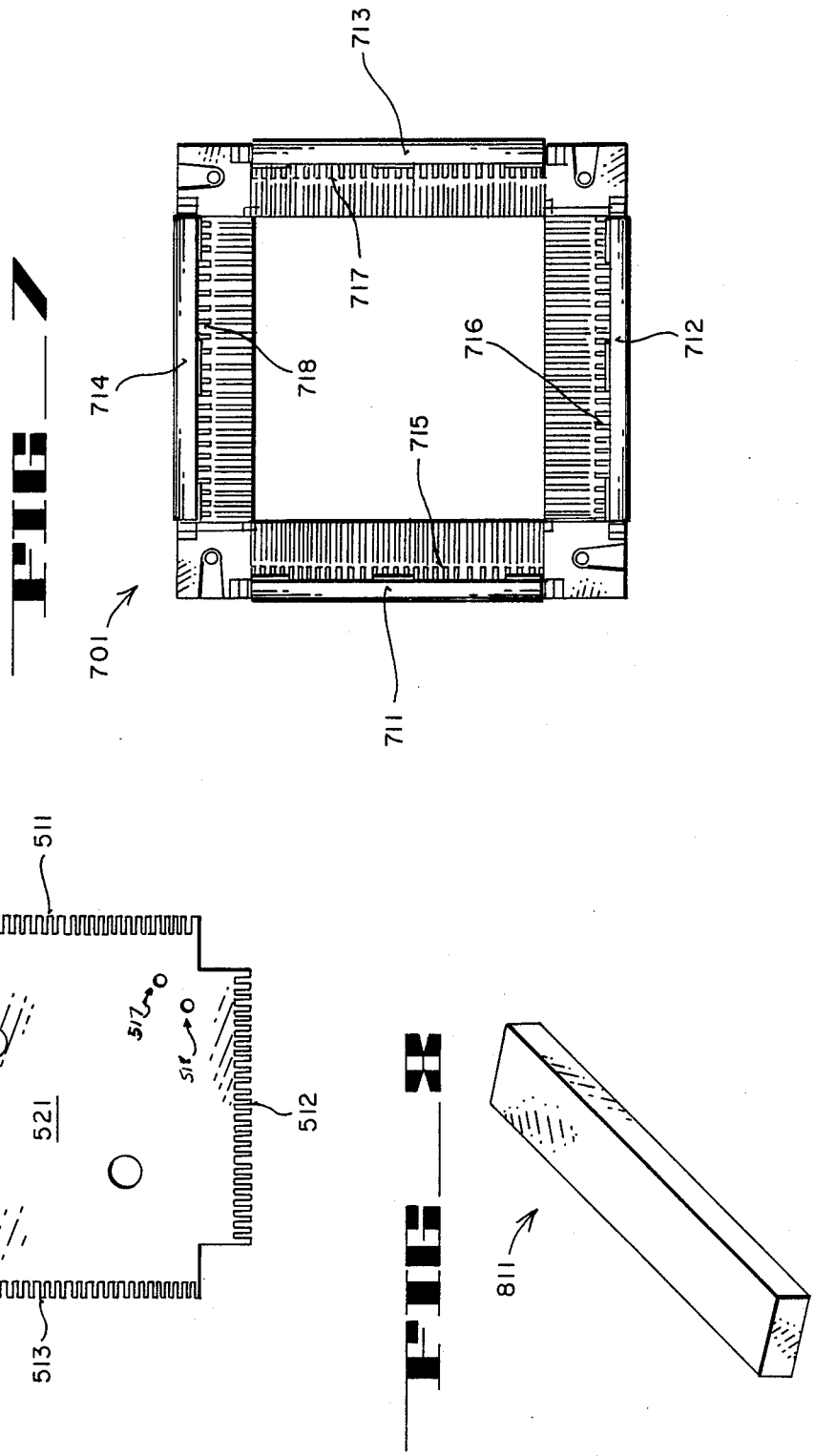

HIGH DENSITY CONNECTION SYSTEM

BACKGROUND OF THE INVENTION

1. Field of the Invention

The present invention relates to the field of electrical connectors and, more specifically, to the field of electrical connectors for connecting circuits to rigid printed circuits board or integrated circuits.

2. Prior Art

In the field of electrical connectors, connectors for connecting circuits to rigid printed circuit (PC) boards often employ pin and socket connectors. With the advancements in the density of integrated circuits, it is desirable to increase the number of connections in a given surface area in a connection system for electrical coupling of such integrated circuits. High density interconnection between electronic devices is crucial to modern computers and other electrical apparatus.

In conventional circuit cables, each line on the cable ends at a lead which is electrically coupled to a pin. The pin is part of a connector assembly which interfaces with a socket. The socket may be coupled with, for example, a rigid PC board having a plurality of integrated circuits mounted thereon.

The number of pins or leads that may be manufactured on a cable is limited by the linear dimensions of the cable. In conventional flat cables known in the prior art, cable leads are typically located on 0.100 inch or 0.050 inch centers. This limits the density of electrical interconnection between electronic devices.

Therefore, it is a primary purpose of the present invention to design an electrical connection system having increased density.

It is a further purpose of the present invention to develop a connection system for coupling an electrical cable with a socket on an electronic device, such socket having an area of accessibility smaller than conventional sockets but which cable has an increased number of leads compared to known cables for coupling with sockets of similar size.

SUMMARY OF THE INVENTION

An apparatus coupling electronics devices is described. The present invention describes an electrical cabling system having increased density from known cabling systems which may be used for coupling electrical cables to sockets on rigid printed circuit boards.

The present invention comprises at least one, and preferably two, cables. In the preferred embodiment the cables are high density flexible circuits. The cable or cables may be inserted in a slot cut diagonally across a rectangular stiffener plate. The cables are bent and fastened to a surface of the stiffener plate. The diagonal slot and cable design allows for a large number of electrical traces (and, therefore, a large number of leads) to be located within a small surface area for interconnection with a socket, printed circuit board or integrated circuit.

BRIEF DESCRIPTION OF THE DRAWINGS

FIG. 1 is a top view of a flexible circuit as may be utilized by the present invention.

FIG. 2(a) is a cross-sectional view of leads of the flexible circuit as may be utilized by the present invention.

FIG. 2(b) is a cross-section view of the flexible circuit as may be utilized by the present invention.

FIG. 2(c) is a top view illustrating a strain relief as may be utilized by the present invention.

FIG. 4 is a top view of a stiffener plate as may be utilized by the present invention.

FIG. 5 is a top view of a second stiffener plate as may be utilized by the present invention.

FIG. 6(a) is a top view of a first strain relief plate as may be used by the present invention.

FIG. 6(b) is a top view of a second strain relief plate as may be used by the present invention.

FIG. 7 is a top view of a socket as may be utilized by the present invention.

FIG. 8 is a top view of a soft-mouthed clamp as may be utilized by the preferred embodiment.

DETAILED DESCRIPTION OF THE PRESENT INVENTION

Figure 3:
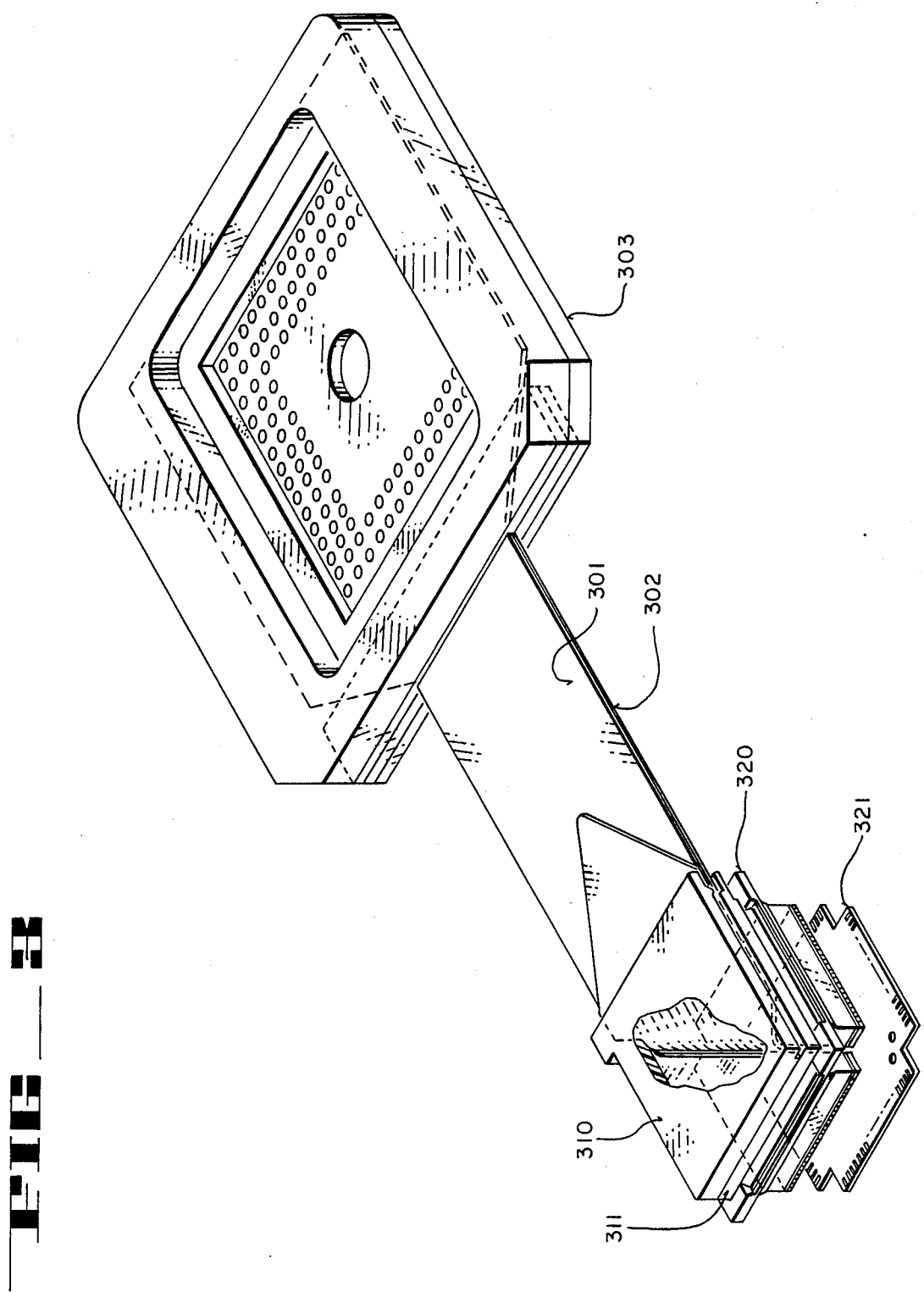
FIG. 3 is an exploded view of the apparatus of the present invention.

An apparatus for connecting a flexible circuit to an integrated circuit or printed circuit board is described. In the following description, numerous specific details are set forth such as types of material, specific dimensions, etc., in order to provide a thorough understanding of the present invention. It will be obvious, however, to one skilled in the art that the present invention may be practiced without these specific details. In other instances, well-known circuits, structures and techniques have not been shown in detail in order not to unnecessarily obscure the present invention.

The present invention discloses a connection system for connecting an electrical cable to an electrical apparatus. In the preferred embodiment, high density flexible circuits are coupled with an integrated circuit or printed circuit board. In particular, the preferred connector is designed to mate with a plastic quad flat package socket having leads located on 0.025 inch centers. However, it will be obvious to one of ordinary skill that other types of electrical cabling may be used without departure from the spirit and scope of the present invention. Further, the electrical cable may be coupled with other electrical apparatus. The present invention will be understood with reference to the accompanying drawings.

Referring first to FIG. 1, the flexible circuit of the preferred embodiment is shown. The flexible circuit of the preferred embodiment comprises a first neck area 101, a flexible circuit cable 103 and a second neck area 105.

The first neck area 101 is disposed at a forty-five (45) degree angle from the flexible circuit cable. The neck area 101 has a plurality of electrical contacts or pads 110 and 111 on two of its edges. The electrical contacts 110 and 111 of the preferred embodiment are offset on 0.025 inch centers. Each edge of the neck area 101 has 25 contacts. In the preferred embodiment, it will be seen that two flexible circuits may be coupled with an electrical apparatus using the connector system of the preferred embodiment. This allows for connection of 100 contacts (25 contacts per edge, 2 edges per connector). The two flexible circuits are designed as mirror images, having the contacts 110 and 111 on opposite sides allowing the contacts to be exposed when the flexible circuits are bent around the stiffener plate of FIG. 4.

The neck area 101 further has a plurality of thru holes 112, 113 and 114 for coupling with a stiffener. (The stiffener is described in more detail in connection with FIG. 4.) The holes 112 and 114 are locating holes for aligning the contacts of the socket shown in FIG. 7. The hole 113 is for clamping the cable to the stiffener.

Electrical circuitry is etched on the flexible circuit by conventional means, providing electrical connection between electrical contacts 110 and 111 on the first neck area 101 and electrical contacts 120 on the second neck area 105. The contacts 110 and 111 on the first neck area 101 are gold pads plated by a post etching process. This process is described in more detail in copending application Ser. No. 053,270, filed May 21, 1987, titled "High Density Flexible Circuit Connector" and assigned to the assignee of the present invention. The use of the post etching process avoids exposed copper along the edges of the pads.

The first neck area 101 is designed to allow a bend to be made in the neck area along line 115. The neck area may be bent at a ninety (90) degree angle to the remainder of the flexible circuit, resulting in a triangular surface area. It will be appreciated that this design allows for improved coupling with the stiffener described in FIG. 4 and further providing for improved density of electrical connections.

Preferably, the flexible circuit cable area 103 comprises a strain relief 116 which will be described in more detail with reference to FIG. 2(c). The flexible circuit cable area 103 of the preferred embodiment measures approximately 5.20 inches in length, although it will be obvious that alternative embodiments may comprise longer or shorter cable lengths.

The second neck area 105 comprises a plurality of through holes 121. A number of the through holes 121 are plated for provided electrical coupling to the etched circuitry of the flexible circuit. The plated through holes of one flexible circuit of the preferred embodiment are shown as x'ed darkened circles 120, while the non-plated through holes are shown as circles 122. The preferred embodiment further provides a through hole 123 for providing additional stability when coupling the second neck area 105 to an electrical apparatus.

Referring now to FIG. 2(a), a cross-sectional view of the flexible circuit through the strain relief 116 is shown in detail. The neck area 101 comprises a 0.003 inch thick Kapton TM base 201 having etched thereon 0.0014 copper leads 202. An adhesive layer 203 is applied to the copper leads. The adhesive layer 203 is preferably 0.001 inches thick. A Teflon TM coating 204 is then applied on the adhesive layer 203 and a second adhesive layer 205 is applied on the coating 204 to a thickness of approximately 0.001 inches. Finally, in the preferred embodiment, a second Kapton TM layer 206 is applied as a strain relief on one side of the flexible circuit. The strain relief 206 is preferably 0.002 inches thick.

FIG. 2(b) illustrates a cross-sectional view of the flexible circuit at areas such as areas 110 and 111 of FIG. 1. The flexible circuit comprises a Kapton TM base 211 having a thickness of 0.003 inches having a copper strip 212 which is 0.0014 inches thick on each side. The copper strip 212 may be etched to form the electrical leads of the flexible circuit. After etching, the copper strip 212 has an adhesive layer 213 applied to it. The adhesive layer is applied to a thickness of 0.001 inches. Finally a Teflon TM coating 214 is applied to the adhesive layer 213 to a thickness of 0.001 inches.

The strain relief 116 of FIG. 1 is shown in more detail with reference to FIG. 2(c). The strain relief 220 is comprised of a Kapton TM layer 0.002 inches thick and has a shaped substantially as indicated in FIG. 2(c).

Referring now to FIG. 3, an exploded view of the connector system of the preferred embodiment is shown. The flexible circuit of FIG. 1 is shown as flexible circuit 301. A second flexible circuit, similar in design to the first flexible circuit is shown as flexible circuit 302. As can be seen, the second neck area of the flexible circuits 301 and 302 are coupled with electrical apparatus 303. The flexible circuits 301 and 302 are inserted through a slot on stiffener 320. The triangular neck areas of circuits 301 and 302 are then bent to meet a surface of stiffener 320. Stiffener 321 is then placed against the triangular neck areas of circuits 301 and 302. Strain relief plates 310 and 311 are coupled with stiffener 320 to provide for strain relief for the flexible circuits 301 and 302.

Referring to FIG. 4, the stiffener plate 320 of FIG. 3 is shown in more detail. The stiffener plate 420 of FIG. 4 defines a diagonal slot 421 for accepting the electrical circuits 301 and 302 of FIG. 3. The diagonal slot 421 is disposed between a first corner 422 of stiffener plate 420 and a second distal corner 423 of stiffener plate 420. As one inventive aspect of the present invention, disposing slot 421 at the illustrated angle allows two flexible circuits to be inserted through the slot. The two flexible circuits are bent ninety (90) degrees from a plane running parallel to the slot. As described above, the flexible circuits have triangular surface areas resulting from bending the circuits. The two triangular surfaces cover the square inner surface of the stiffener plate.

Preferably, the stiffener plate 420 is comprised of a 10% glass filled polycarbonate material, although it will be obvious to one of ordinary skill that alternative materials having similar manufacturing and rigidity characteristics may be used without departure from the present invention.

The stiffener plate has clamping holes 430, 431, 432 and 433. The clamping holes 430-433 define threaded inserts. Holes 431 and 433 are used for clamping two flexible circuits and stiffener plate 521 (shown in FIG. 5) to the stiffener plate 420. The holes 430 and 432 are used for clamping strain reliefs 610 (of FIG. 6a) and 611 (of FIG. 6b) to the top surface of the stiffener plate 420.

The stiffener plate 420 further comprises locating pins 425, 426, 427 and 428 for positioning the flexible circuit on the surface of stiffener plate 420. The locating pins 425-428 correspond to locating holes 112 and 4 of the two flexible circuits and allow for proper alignment of the contact pads.

The stiffener plate 420 further comprises latching areas 440, 441, 442 and 443 on each of its four edges for latching with a socket as shown in FIG. 7. The socket of FIG. 7 comprises latching means for latching with latch areas 440, 441, 442 and 443.

Referring now to FIG. 5, a second stiffener plate 521 corresponding to stiffener plate 321 of FIG. 3 is shown. The second stiffener plate 521 defines combs along each of its four outside edges 511, 512, 513 and 514. The combs are used to provide positive contact of the pads of the flexible circuits to contacts of a socket or integrated circuit. The stiffener plate 521 has holes 515, 516, 517 and 518. The holes 515-518 are alignment holes and correspond to locating pins 425, 426, 427 and 428 of stiffener plate 420. The combs further serve to prevent opens or shorts between the contact pads of the flexible circuits. The second stiffener plate 521 is preferably made of a 10% glass filled polycorbonate or equivalent material.

The preferred embodiment further comprises two strain relief plates shown as plates 610 and 611 of FIGS. 6(a) and 6(b), respectively. These strain relief plates 610 and 611 correspond to strain relief plates 310 and 311, respectively of FIG. 3. In the preferred embodiment, strain relief plate 611 has a slot 620 through which the two flexible circuits are displaced. Strain relief plate 611 is placed against a second side of stiffener plate 420 of FIG. 4.

Strain reliefs 610 and 611 define clamping holes 617 and 618, and 621 and 622, respectively. The clamping holes 617, 618, 621 and 622 correspond to holes 430 and 432 of the stiffener plate 420. The strain reliefs 610 and 611 are preferably constructed of zinc #3 ASTM-AG40A coated with polyurethane.

After the flexible circuits are disposed through slot 620, strain relief 610 is placed on top of strain relief 611. The flexible circuits are bent and disposed between surface 630 (bottom surface in FIG. 6a) of strain relief 610 and surface 631 (top surface in FIG. 6b) of strain relief 611.

Strain reliefs 610 and 611 further comprise soft-mouthed clamps 811 shown in FIG. 8. The soft mouthed clamp is coupled to the surfaces 632 and 633 of strain relief clamps 610 and 611. The soft mouthed clamp provides additional protection for the flexible circuits. The soft mouthed clamp 811 is preferably constructed of a cellular urethane having an adhesive backing for coupling with the strain reliefs 610 and 611.

Referring now to FIG. 7, a top view of a socket as may be utilized by the present invention is shown. The first stiffener 420 of FIG. 4 is coupled with the socket 701 by latching areas 440, 441, 442 and 443 on the stiffener 420 (shown in FIG. 4) and latching means 711, 712, 713 and 714 on the socket 701. The socket 701 further comprises a plurality of contacts on each of its four edges shown as contacts 715, 716, 717 and 718. The contacts are aligned with the contact pads of the flexible circuits for making electrical connection with an integrated circuit, printed circuit board or other electrical apparatus.

Thus, an apparatus for connecting a flexible printed circuit or other cabling device to an integrated circuit or printed circuit board is described. Although the present invention has been described with specific reference to a number of details of the preferred embodiment, it will be obvious that a number of modifications and variations may be employed without departure from the scope and spirit of the present invention. Accordingly, all such variations and modifications are included within the intended scope of the invention as defined by the following claims.

I claim:

1. A high density flexible circuit connector system for electrical coupling of high density flexible circuits with an electrical apparatus comprising:
   a first rectangular stiffener plate having a slot disposed diagonally from one corner to an opposite corner of said plate;
   a first flexible circuit having a substantially triangular neck area disposed at a 45 degree angle from the remaining first flexible circuit, said first neck area coupled with said stiffener plate through said slot;
   a second flexible circuit having a substantially triangular neck area disposed at a 45 degree angle from the remaining second cable, said second neck area coupled with said first stiffener plate through said slot;
   fastening means for fastening said first neck area and said second neck area to a surface of said first stiffener plate.

2. The connector system as recited by claim 1 further comprising a second stiffener plate coupled with said first neck area and said second neck area at said surface of said first stiffener plate.

3. A connector for coupling an electrical cable means with electrical circuitry, comprising:
   a substantially rectangular means having a slot disposed from one corner of said rectangular means to another corner of said rectangular means in a substantially diagonal direction for receiving said electrical cable means.

4. A connector for coupling an electrical cable means with electrical circuitry, comprising:
   a first stiffener means for receiving said electrical cable means, said first stiffener means having a substantially rectangular shape, said first stiffener means further having a slot disposed from one corner of said stiffener means to another corner of said stiffener means in a substantially diagonal direction;
   a second stiffener means for coupling said second stiffener means with said electrical cable means, said second stiffener means having combs etched and spaced along the outer edge of said second stiffener means such that conductive pads are located in the open spaces between said combs.

5. A connector for coupling with electrical circuitry a first flexible circuit with exposed conductive pads and a second flexible circuit with exposed conductive pads, comprising:
   a first stiffener plate having a slot disposed across said first stiffener plate, said slot being formed starting at a first proximate point of the edge of said first stiffener plate and ending at a second distal point opposite said first point;
   a fastening means for fastening said first flexible circuit and said second flexible circuit to a surface of said first stiffener plate;
   a second stiffener means for coupling with said first and said second flexible circuits at said surface of said first stiffener means, said second stiffener means having combs etched and spaced along the outer edge of said second stiffener means such that said conductive pads are located in the open spaces between said combs.

6. A connector system for connecting an electrical cable means with an electrical component, comprising:
   a first substantially rectangular stiffener plate having a slot disposed diagonally from one corner to an opposite corner of said first plate;
   a first cable means and a second cable means inserted in said slot and bent in opposite directions, 90 degrees from a plane running through said slot and perpendicular to said first plate such that a surface area of said first plate is covered by said first cable means and said second cable means.

7. The connector system as recited by claim 6 further comprising a fastener means for fastening said first cable means and said second cable means to said surface area of first plate.

8. The connector system as recited by claim 7 wherein said first cable means and said second cable means comprise flexible circuits.

9. The connector system as recited by claim 8 wherein said flexible circuit of said first cable means and said second cable means has exposed conductive pads aligned along the perimeter of said first stiffener plate.

10. The connector system as recited by claim 9 further comprising a second stiffener plate coupled with said first cable and said second cable along said first surface of said first plate.

11. A connector system for connecting an electrical cable means with an electrical component, comprising:
 a first substantially rectangular stiffener plate having a slot disposed diagonally from one corner to an opposite corner of said first plate;
 a first cable means and a second cable means inserted in said slot and bent in opposite directions such that a surface area of said first plate is covered by said first cable means and said second cable means.

* * * * *